United States Patent
Zimmerman et al.

(10) Patent No.: US 6,319,811 B1
(45) Date of Patent: Nov. 20, 2001

(54) BOND PLY STRUCTURE AND ASSOCIATED PROCESS FOR INTERCONNECTION OF CIRCUIT LAYER PAIRS WITH CONDUCTIVE INKS

(76) Inventors: Scott Zimmerman; Brad Banister; Richard J. Pommer, all of AlliedSignal, Inc. 2950 Redhill Ave., Costa Mesa, CA (US) 92626

( * ) Notice: Subject to any disclaimer, the term of this patent is extended or adjusted under 35 U.S.C. 154(b) by 0 days.

(21) Appl. No.: 09/510,574

(22) Filed: Feb. 22, 2000

(51) Int. Cl.[7] ................................................. H01L 21/4763
(52) U.S. Cl. .......................... 438/618; 438/622; 438/612; 438/106; 29/852; 29/830
(58) Field of Search .................... 438/106, 612, 438/622, 618, 666, 667; 29/852, 830

(56) References Cited

U.S. PATENT DOCUMENTS

| | | | |
|---|---|---|---|
| Re. 36,396 | * | 11/1999 | Arthur et al. ........................ 428/331 |
| 4,528,072 | * | 7/1985 | Kurosawa et al. ................... 204/15 |
| 4,644,643 | * | 2/1987 | Sudo ..................................... 29/845 |
| 5,077,115 | * | 12/1991 | Arthur et al. ........................ 428/137 |
| 5,245,751 | * | 9/1993 | Locke et al. ......................... 29/852 |
| 5,379,515 | * | 1/1995 | Kondo et al. ........................ 29/852 |
| 5,386,627 | * | 2/1995 | Booth et al. ......................... 29/852 |
| 5,652,055 | * | 7/1997 | King et al. ........................... 428/343 |
| 5,819,406 | * | 10/1998 | Yoshizawa et al. ................. 29/877 |
| 5,888,654 | * | 3/1999 | Gardeski et al. ................... 428/413 |
| 5,948,533 | * | 9/1999 | Gallagher et al. .................. 428/418 |
| 6,015,607 | * | 1/2000 | Fraivillig ............................. 428/214 |
| 6,074,728 | * | 6/2000 | Ryu ..................................... 428/209 |
| 6,127,619 | * | 10/2000 | Xi et al. ............................... 136/203 |
| 6,137,185 | * | 10/2000 | Ishino et al. ........................ 257/786 |

FOREIGN PATENT DOCUMENTS

01315131 * 8/1991 (JP) .............................. C09J/163/10

OTHER PUBLICATIONS

Sepraphim, D., Lasky, R., Li, Che–Yu, "Principles of Electronic Packaging", McGraw–Hill Book Company, New York (1989).*
Pecht, M., "Handbook of Electronic Package Design", Marcel Dekker, Inc., New York (1991), pp. 212–213.*

* cited by examiner

Primary Examiner—Matthew Smith
Assistant Examiner—Renzo Rocchegiani
(74) Attorney, Agent, or Firm—Fish & Associates, LLP; Robert D. Fish

(57) ABSTRACT

A unique bond-ply structure and associated processes for processing of the bond-ply structure and for joining together circuit layer pairs which makes it possible to create a bond-ply having raised structures of conductive material which compensate for shrinkage during sintering thus creating a stress-free and void-free electrically conductive junction between layer-pairs in an interconnect.

10 Claims, 3 Drawing Sheets

BOND PLY STRUCTURE AND ASSOCIATED PROCESS FOR INTERCONNECTION OF CIRCUIT LAYER PAIRS WITH CONDUCTIVE INKS

FIELD OF THE INVENTION

The field of the invention is integrated circuit packaging.

BACKGROUND OF THE INVENTION

High density electronic interconnections are required for many important applications including ball grid array packages, high density electronic circuit boards, cell phones and other miniature electronic devices. In one fabrication scheme for high density interconnection, electronic circuitry is fabricated onto both sides of individual layer pairs with through vias connecting the circuitry on the two sides. These layer pairs may then be physically and electronically joined by fabricating a bond ply material with through-holes drilled or lased, filling these holes with sinterable conductive pastes or solders, by stacking the layer pairs and the bond plies in a press, and by curing the resulting structure. The curing process can sinter the paste or solder providing for electronic interconnection between layer pairs and at the same time cure the bond ply material, providing for permanent physical bonding of the structure. However conductive inks and pastes and solders generally shrink significantly during the sintering or soldering process. This shrinkage occurs as the solder or paste sinters, often causing voids or open circuit interconnection. The shrinkage also can force considerable stress into the overall structure, leading to unreliable interconnection or bonding between the layers. Thus, there is a need for material and associated processes which can compensate for this shrinkage providing for stress-free and reliable electronic interconnection between the layer pairs.

SUMMARY OF THE INVENTION

The present invention is directed to a unique bond-ply structure and associated processes for processing of the bond-ply structure and for joining together circuit layer pairs. The disclosed structure and methods makes it possible to create a bond-ply having raised structures of conductive material which compensate for shrinkage during sintering, thus creating a stress-free and void-free electrically conductive junction between layer-pairs in an interconnect.

Various objects, features, aspects and advantages of the present invention will become more apparent from the following detailed description of preferred embodiments of the invention, along with the accompanying drawings in which like numerals represent like components.

DETAILED DESCRIPTION

Figure 1:
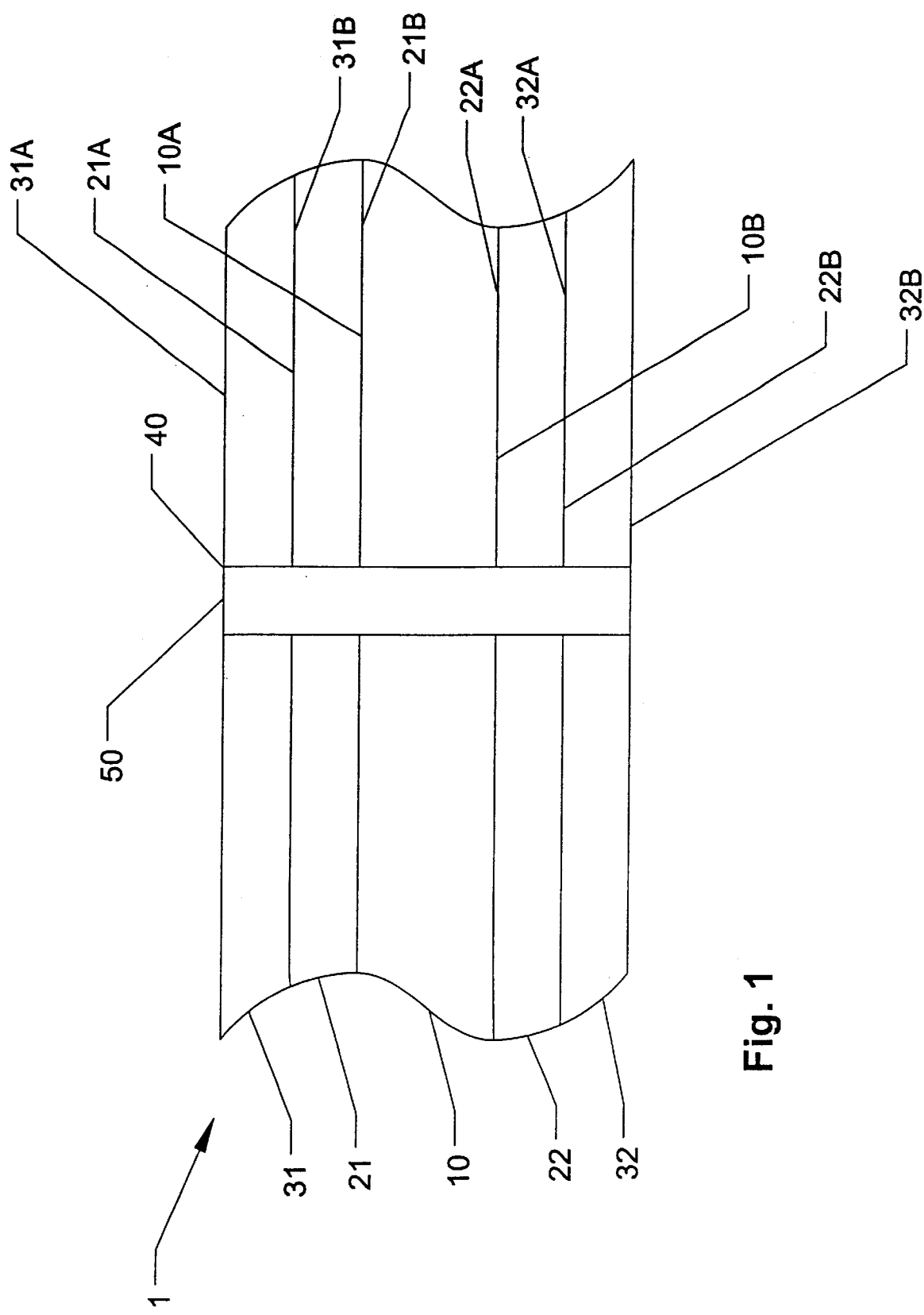
FIG. 1 is a view of a bond-ply embodying the invention.
Figure 2:
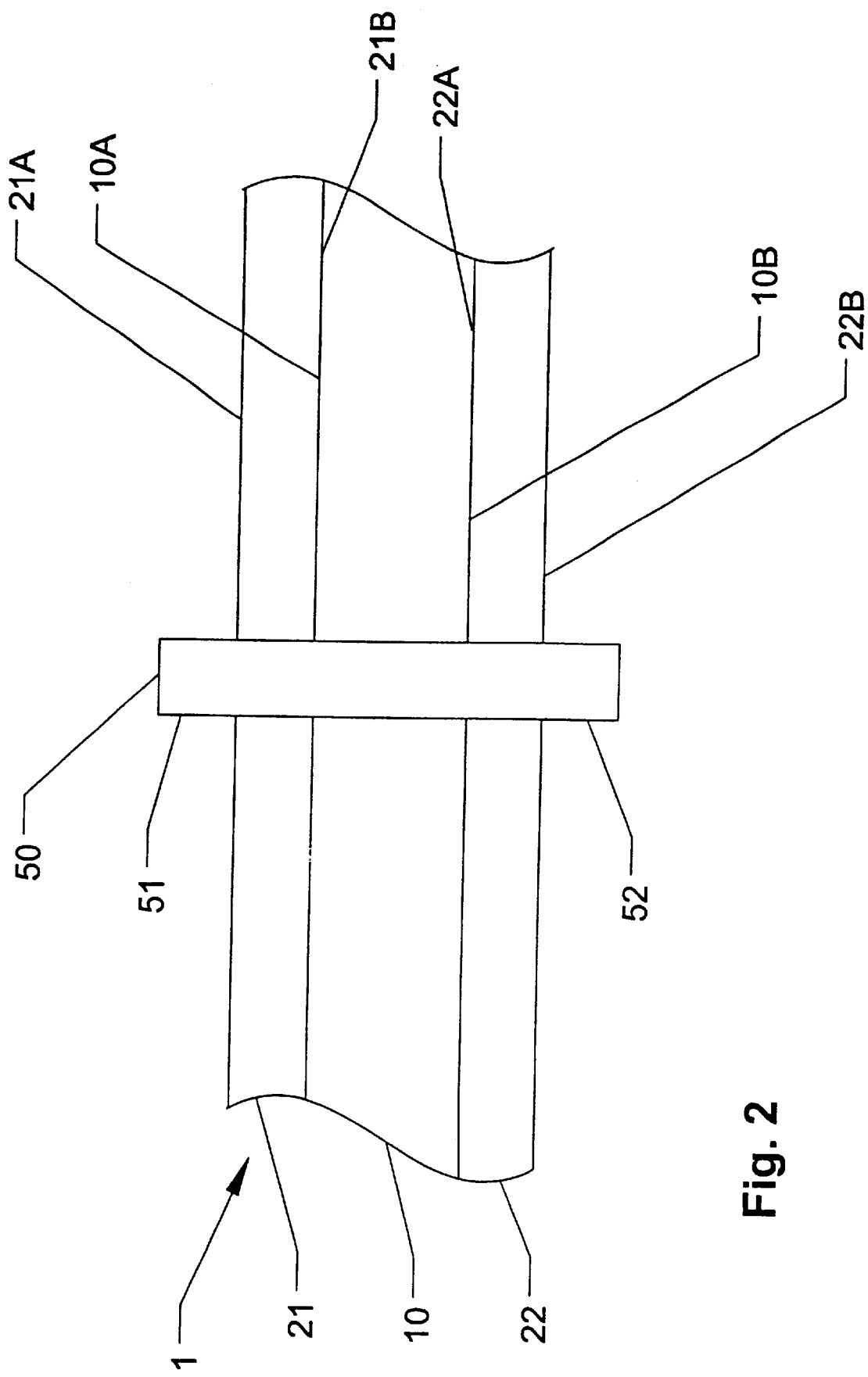
FIG. 2 is a view of the bond-ply of FIG. 1 with the release sheets removed and nubs exposed.

Referring to FIGS. 1 and 2, a bond-ply 1 generally comprises a base layer 10, adhesive layers 21 and 22, protective release sheets 31 and 32, via 40, and conductive material 50. Base layer 10 comprises an upper surface 10A and a lower surface 10B. Adhesive layers 21 and 22 comprise upper surfaces 21A and 22A and lower surface 21B and 22B. Protective release sheets 31 and 32 comprise upper surface 31A and 32A and lower surfaces 31B and 32B. Nubs 51 and 52 shown in FIG. 2 comprise the portions of conductive material 50 located within the portions of via 40 formed by release sheets 31 and 32.

The base layer 10 is preferably a reinforced polymeric core, but may comprise any suitable bond-ply core material. Bond-ply 1 may have two adhesive layers as shown or may have a single adhesive layer. The adhesive layer(s) of bond-ply 1 are preferred to comprise an uncured polymer but may comprise any bond-ply adhesive. Via 40 is preferably filled with sinterable conductive material 50 such as a conductive ink, paste or solder using standard pressure filling methods. Conductive materials particularly suited to the structures and methods disclosed herein are transient liquid sintering pastes such as those described in issued US patents assigned to Ormet.

Release sheets 31 and 32 each have a specific thickness chosen so as to leave a measured quantity of excess conductive ink, paste, or solder as raised regions above the plane of the bond ply material, i.e. nubs/nubbins such as nubs 51 and 52 of FIG. 2. The measured quantity, defined by the thickness of the release layer is chosen to compensate for shrinkage to provide for a highly filled conductive region after sintering is complete. A particularly convenient release layer is provided by copper foil which is readily available in specific thicknesses, which releases readily from polymeric layers or adhesives, which is relatively inexpensive, which may be laser ablated to provide for vias through the bond ply, and which is very convenient for assembly of the bond ply from prefabricated cores and resin coated copper.

Nub 51 can be formed by providing a bond-ply having a first adhesive layer 21 and a first release layer 31, the first release layer 31 having an inner surface 31B substantially in contact with a surface 21A of the first adhesive layer, and an outer surface 31A opposite the inner surface which does not contact the first adhesive layer 21; providing a via 40 which passes through the first adhesive layer 21 and first release layer 31 including through both the inner and outer surfaces 31A and 31B of the first release layer 31; filling the via 40 with a conductive material 50 such that the material 50 substantially fills the entire via 40 including the portion extending out of the first adhesive layer 21 and through the first release layer 31; removing the first release layer 31 from the first adhesive layer 21 while leaving at least a portion of the material 50 previously located within the portion of the via 40 extending through the first release layer 31 extending outward from the via 40 and beyond the surface 21A of the first adhesive layer 21 as a first nub 51.

A bond ply having a second nub 52 can be formed in a fashion similar to that of nub 51. In particular, the provided bond-ply can have a second adhesive layer 22 and a second release layer 32 with the via 40 passing through the second adhesive layer 22 and second release layer 32 in the same manner that it passes through the first adhesive layer 21 and first release layer 31, and the second release layer 32 can be removed to form a second nub 52 in the same way as the first release layer 31 was removed to form nub 51.

A refinement of the disclosed methods would include choosing the thickness of the first and second release sheets to correspond to a desired size for the first and second nubs.

It should be readily apparent that the disclosed methods are equally applicable when the bond-ply comprises a plurality of vias and that application of the disclosed method in such a case would result in a plurality of nubs, one for each side of each via, remaining on the bond-play after removal of the release sheets.

Figure 3:
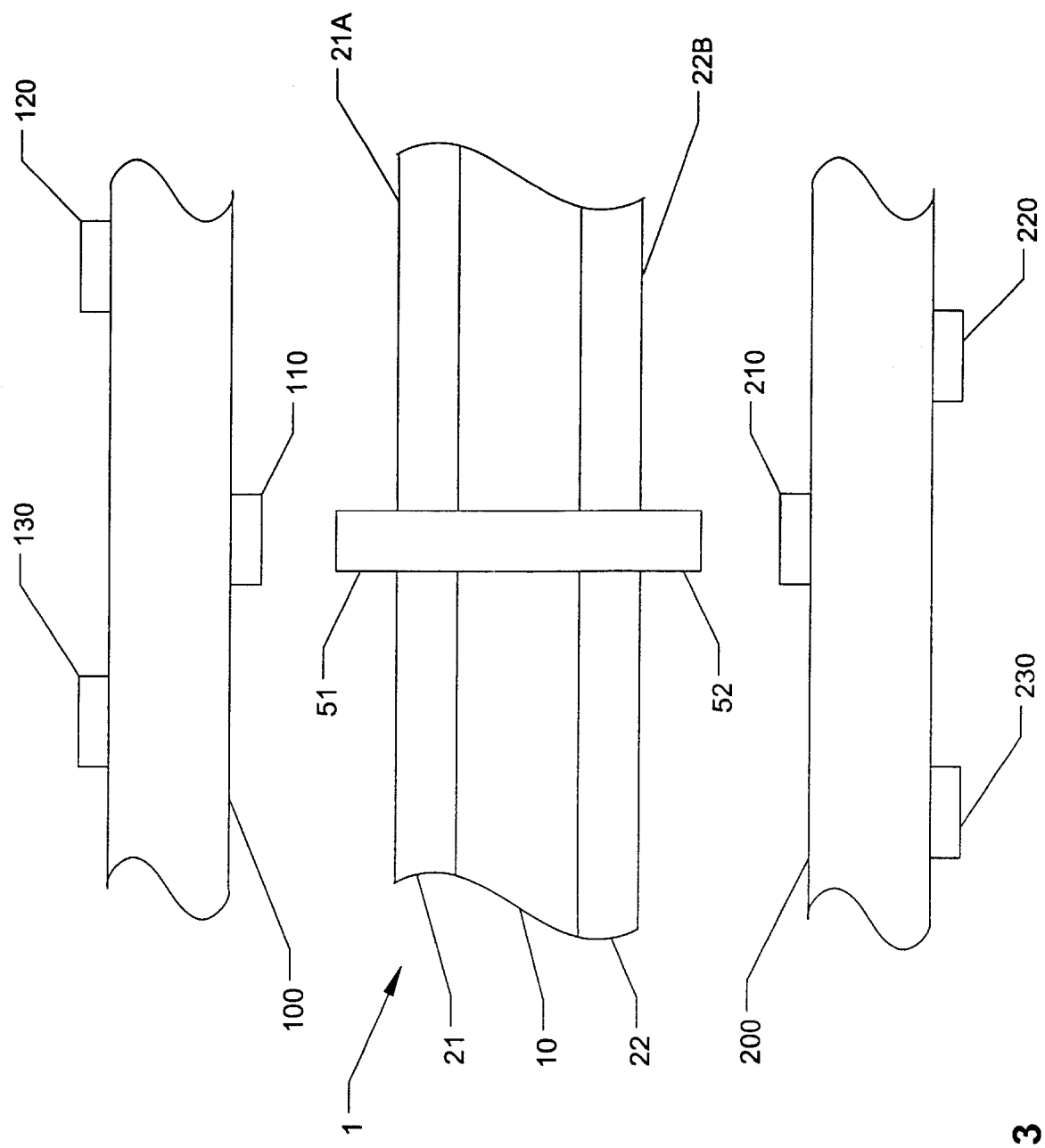
FIG. 3 is a view of the bond-ply of FIG. 1 positioned between layer pairs prior to lamination.

Referring to FIG. 3, a laminated bond-ply/interconnect can be formed by laminating the bond-ply 1 between a first layer pair 100 and a second layer pair 200 such that the first nub 51 is compressed by and against a contact pad 110 on the first layer pair and the second nub 52 is compressed by and against a contact pad 210 on the second layer pair. Such an interconnect would comprise a bond-ply 1 having a core 10 sandwiched between two adhesive layers 21 and 22, the bond-ply 1 also having a via 40 filled with sintered conductive material 50 extending through the core 10 and adhesive layers 21 and 22, the conductive material comprising a compressed nub (51 and 52) in each of the two adhesive layers.

It is preferred that such an interconnect could be subjected to heat processing so as to cause sintering of the conductive material and to form a relatively stress free connection between the contact pad on the first layer pair and the contact pad on the second layer pair.

Thus in the process provided for this invention, bond ply material is fabricated with specified thickness of copper or other release materials. Through vias are fabricated by mechanical drilling or laser drilling. The vias through both the release layer and the internal bond ply are filled with a conventional pressure filling apparatus. The release films are removed, leaving raised nubbins protruding from each via. The bond ply layers are stacked with corresponding layer pairs in a conventional lamination press and the entire structure is cured under pressure at elevated temperature using a cycle designed to cure the adhesives and to sinter the conductive ink, paste, or solder.

It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method for forming nubs on a bond-ply comprising:
   providing a bond-ply having a first adhesive layer and a first release layer, the first release layer having an inner surface substantially in contact with a surface of the first adhesive layer, and an outer surface opposite the inner surface which does not contact the first adhesive layer;
   providing a via which passes through the first adhesive layer and first release layer including through both the inner and outer surfaces of the first release layer;
   filling the via with a conductive material such that the material substantially fills the entire via including the portion extending out of the first adhesive layer and through the first release layer;
   removing the first release layer from the first adhesive layer while leaving at least a portion of the conductive material previously located within the portion of the via extending through the first release layer extending outward from the via and beyond the surface of the first adhesive layer as a first nub.

2. The method of claim 1 wherein the bond-ply further comprises a second adhesive layer and a second release layer with the via filled and passing through the second adhesive layer and second release layer in the same manner that it is filled and passes through the first adhesive layer and first release layer; the method further comprising removing the second release layer from the second adhesive layer while leaving at least a portion of the conductive material previously located within the portion of the via extending through the second release layer extending outward from the via and beyond the surface of the second adhesive layer as a second nub.

3. The method of claim 2 wherein the thickness of the first release sheet is chosen to correspond to a desired size for the first nub and the second release sheet is chosen to correspond to a desired size for the second nub.

4. The method of claim 3 further comprising cooling the bond-ply after filling the via and prior to removal of the first release layer.

5. The method of claim 4 further comprising laminating the bond-ply between a first layer pair and a second layer pair such that the first nub is compressed by and against a contact pad on the first layer pair and the second nub is compressed by and against a contact pad on the second layer pair.

6. The method of claim 5 wherein the laminated bond-ply is subjected to heat processing so as to cause sintering of the conductive material.

7. The method of claim 6 wherein the sintered conductive material forms a relatively stress free connection between the contact pad on the first layer pair and the contact pad on the second layer pair.

8. The method of claim 2 wherein the conductive material is an ink.

9. A method of processing a bond ply material comprising:
   specifying a thickness for a release sheet for a bond-ply;
   providing a bond ply having a release sheet of the specified thickness and also having an adhesive layer;
   drilling vias through the entire bond-ply including the release sheet and adhesive layer;
   pressure filling the vias with a conductive material;
   removing the release sheet so as to leave a raised nub protruding from each via;
   providing a layer pair;
   laminating the bond-ply and layer pair;
   curing the laminated bond-ply and layer pair under pressure at elevated temperature using a cycle designed to cure the adhesives layer and to sinter the conductive material.

10. The method of claim 9 wherein the release sheet is copper.

* * * * *